United States Patent [19]
Wood

[11] Patent Number: 4,970,512
[45] Date of Patent: Nov. 13, 1990

[54] PRINTED CIRCUIT ROTARY SWITCH WITH DECODER

[76] Inventor: Lawson A. Wood, 905 N. Frederick St., Arlington, Va. 22205

[21] Appl. No.: 332,337

[22] Filed: Apr. 3, 1989

[51] Int. Cl.$^5$ .................. H03M 11/00; H01H 19/00
[52] U.S. Cl. .................................. 341/35; 200/11 R; 200/11 DA; 341/20
[58] Field of Search ............ 200/11 R, 11 D, 11 DA, 200/11 G, 11 J, 11 TW, 16 R, 292, 511–517, 292; 361/20, 21, 24, 35

[56] References Cited

U.S. PATENT DOCUMENTS

| | | | |
|---|---|---|---|
| 2,165,200 | 7/1939 | Batcheller | 200/565 |
| 3,584,163 | 6/1971 | White | 200/565 X |
| 3,903,383 | 9/1975 | Marker | 200/565 X |
| 4,066,851 | 1/1978 | White et al. | 200/5 A |
| 4,246,452 | 1/1981 | Chandler | 200/6 A X |
| 4,405,841 | 9/1983 | Van Zeeland | 200/11 R |
| 4,430,540 | 2/1984 | Scalf | 341/35 X |
| 4,435,796 | 3/1984 | Saito et al. | 200/564 X |
| 4,536,628 | 8/1985 | Willhaus | 200/5 A X |
| 4,625,084 | 11/1986 | Fowler et al. | 200/11 G X |

Primary Examiner—J. R. Scott
Attorney, Agent, or Firm—Spencer & Frank

[57] ABSTRACT

A rotary switch which cooperates with a printed circuit board employs a knob member having a handle portion that protrudes through an opening in a panel of an equipment housing. The printed circuit board is spaced beneath the panel and has printed wiring contacts that are disposed along a circular path beneath the knob member. Switches which include the printed wiring contacts are opened and closed when the knob member is rotated. In one embodiment, four pairs of printed wiring contacts are disposed on the PCB at 90° intervals and a spacer sheet having openings positioned at the contact pairs rests on the PCB. A contactor sheet rests on the spacer sheet and supports contactor elements that are positioned to protrude through the openings and bridge the contactor pairs when the appropriate region of the contactor sheet is depressed. Such depression is accomplished by contactor legs extending from a contactor member affixed to the underside of the knob member. A decoder circuit connected to the contact pairs provides output signals corresponding to the angular position of the knob member. Such a rotary switch is particularly useful for setting the time for appliances such electrical clocks or video cassette recorders.

22 Claims, 5 Drawing Sheets

PRINTED CIRCUIT ROTARY SWITCH WITH DECODER

BACKGROUND OF THE INVENTION

The present application is directed to a rotary switch, and more particularly to a rotary switch which cooperates directly with printed wiring contacts carried by a printed circuit board.

Push button switches which cooperate directly with printed wiring contacts on a printed circuit board are known. A typical switch of this type employs a pair of closely spaced printed wiring contacts, which may have comb-like configurations and be interleaved but which are nevertheless electrically disconnected from one another. A plastic spacer sheet rests on the printed circuit board and is provided with an aperture through which the pair of wiring contacts is exposed. A plastic contactor sheet rests on the spacer sheet. A metallic contactor element is affixed to the contactor sheet at a position above the pair of wiring contacts. Normally the contactor element is spaced apart from the printed wiring contacts by approximately the thickness of the spacer sheet. However, when the contactor sheet is pressed in the region above the contactor element, the contactor sheet protrudes through the aperture in the spacer sheet and the contactor element bridges the pair of wiring contacts, thereby electrically connecting them. De-bouncing circuitry is typically employed on the printed circuit board to avoid contact bounce. When the pressure on the contactor sheet is released, it springs back to its original position due to the resilience of the plastic and thereby opens the switch.

In this application, the term "printed wiring contact" will be used to designate a portion of the printed wiring pattern on a PCB, and particularly that portion which comes selectively into contact with some other conductor and serves as a switch contact. The printed wiring pattern on the PCB normally also includes conductors for connecting the printed wiring contacts to circuit elements mounted on the PCB and further conductors for establishing the desired connections among the circuit elements.

In a variation on the typical push button switch described above, there is only one printed wiring contact on the printed circuit board, and printed wiring on the contactor sheet is connected to the contactor element. When the contactor sheet is depressed, the contactor element touches the printed wiring contact on the PCB to electrically connect the printed wiring contact to the printed wiring on the contactor sheet. In yet another known push button switch employing printed wiring contacts, a pair of spaced apart printed wiring contacts is again provided on the PCB. However, instead of both a spacer sheet and a contactor sheet, a single, molded contactor sheet is used. The molded contactor sheet rests directly against the PCB but has a blister portion above the printed wiring contacts. The contactor element is affixed to the contactor sheet at the center of the blister portion, and is normally spaced apart from the printed wiring contacts. However, the blister portion collapses when it is depressed, thereby moving the contactor element into electrical contact with the printed wiring contacts.

Push button switches with printed wiring contacts are far less expensive than push button switch assemblies which are mounted on a chassis with nuts or other hardware and electrically connected to a printed circuit board using individual wires. For this reason, push button switches with printed wiring contacts are used in a wide variety of products, ranging from pocket calculators to digital clocks and video cassette recorders. In particular, push button switches with printed wiring contacts are frequently used to set the time depicted on displays in clocks and VCR's. In relatively inexpensive products the time might be set using a single push button switch. The time depicted on the display is incremented slowly when the single push button is first depressed, and then advances more rapidly. To set the time, the single push button must be released at the precise moment when the desired time is depicted on the display. If one overshoots, it is necessary to suffer the boredom of keeping the push button depressed while 24 hours blink by on the display in order to make a second attempt at setting the time. One's attention tends to wander during this procedure, and a third or even a fourth attempt may be necessary before the time is finally set.

In more expensive equipment, multiple push buttons using printed wiring contacts may be employed to set the time on the display. For example, if two push buttons are present, one can be used to increment the time depicted on the display and the other can be used to decrement the displayed time if there has been an overshoot. If four push buttons are present, one pair might be used for rapid incrementing and decrementing and the other pair for slow incrementing and decrementing. Even with the flexibility afforded by four push button switches, however, the process of setting the time is time-consuming and frustrating. This is particularly true when a VCR is being programmed with the starting times and ending times of a sequence of television programs which are to be recorded.

SUMMARY OF THE INVENTION

An object of the invention is to provide a rotary rather than a push button switch using printed wiring contacts.

Another object of the invention is to facilitate the procedure for setting the time in digital clocks and video cassette recorders by providing a rotary switch having printed wiring contacts.

These and other objects which will become apparent in the ensuing detailed description can be attained by providing a printed circuit board having printed wiring contacts which are disposed about a circular path. A knob member has a handle portion that protrudes through an opening in an outer panel, which is parallel to the printed circuit board. The knob number has a bottom portion on which is mounted a contactor member having spring-like contactor fingers. These contactor fingers move along the circular path when the handle portion of the knob member is manually rotated. The contactor fingers may come into direct electrical contact with the printed wiring contacts, or a spacer sheet with apertures and a plastic contactor sheet bearing contactor elements may be provided, in which case the contactor fingers would exert pressure on the contactor sheet to selectively displace the contactor elements toward the printed wiring contacts.

In accordance with one aspect of the invention, the printed wiring contacts on the printed circuit board may be grouped in pairs, with one printed wiring contact of each pair being maintained at a predetermined potential. A decoder is connected to the other printed wiring contact of each pair to produce a signal corresponding to the angular position of the knob member. However, instead of pairs of printed wiring contacts on the PCB, individual printed wiring contacts at different angular positions on the PCB may be used in conjunction with a spacer sheet and a contactor sheet with printed wiring which is connected to contactor elements affixed to the contactor sheet.

In accordance with another aspect of the invention, a contactor sheet having blister regions may be provided, with the blister regions being disposed along a circular path corresponding to the circular path along which the printed wiring contacts of the PCB are positioned. The contactor sheet rests directly against the printed circuit board, and contactor elements are affixed to the contactor sheet in the blister regions. Instead of a knob which supports a contactor member with contactor fingers, a knob having cam surfaces which selectively collapse the blister regions is employed.

DESCRIPTION OF THE PREFERRED EMBODIMENTS

Figure 1:
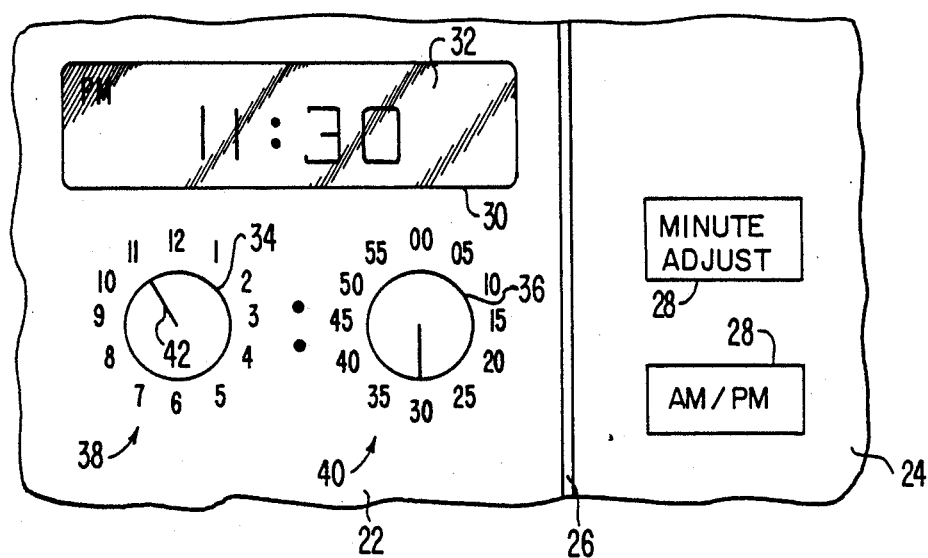
FIG. 1 is a top view of a portion of the outer housing of a video cassette recorder, and illustrates a time display, two push button switches, and two rotary switches in accordance with the present invention for setting hours and minutes.

In FIG. 1, a video cassette recorder (VCR) 20 has an outer case with a raised panel 22, a lower panel 24, and a step portion 26 connecting panels 22 and 24. Panels 22 and 24 are parallel to a printed circuit board (not illustrated in FIG. 1) beneath panels 22 and 24. Panel 24 is spaced close to the printed circuit board and has rectangular openings which permit manual access to push button switches that cooperate with printed wiring contacts (not illustrated) on the printed circuit board. Although not illustrated, these push button switches may include a spacer sheet resting on the printed circuit board and having apertures corresponding to openings 28, and a contactor sheet sandwiched between the spacer sheet and panel 24. Affixed to the underside of the contactor sheet are contactor elements which bridge the respective pairs of printed wiring contacts when the contactor sheet is depressed through openings 28. As is shown in FIG. 1, "MINUTE ADJUST" and "AM/PM" are printed on the contactor sheet at the appropriate positions to identify the functions of the push button switches. These functions will be described in more detail later.

Raised panel 22 has a rectangular opening 30 through which a digital display 32 mounted on the PCB can be seen. Display 32 depicts the time and, depending upon the particular operation of VCR 20, may also depict other information such as channel numbers, the day of the week, or VCR programming instructions. Below display 32, panel 22 has circular openings 34 and 36 for accommodating rotary switches 38 and 40 in accordance with the present invention. Switches 38 and 40 have respective knob members, which will be described in more detail later, on which are inscribed pointers 42. Minutes, in five minute intervals, are depicted around opening 36 and hours are depicted around opening 34. The knob members are manually twisted to direct the pointers 42 toward the desired hours and minutes. For example, to set the time at "11:30 PM," as shown on display 32, switch 38 is rotated to the "11" position and switch 40 is rotated to the "30" position. The designation "PM" is set using the "AM/PM" push button switch, which toggles back and forth between "AM" and "PM" when the switch is repeatedly depressed. In many situations the five minute intervals available via rotary switch 40 are sufficient for programming a VCR. However, VCR 20 is provided with the "MINUTE ADJUST" push button switch to permit finer resolution. When the last digit shown on display 32 is "0" and the "MINUTE ADJUST" push button switch is depressed, the last digit slowly increments through the sequence "1," "2," "3," "4" and then back to "0." When the last digit shown on display 32 is "5" and the "MINUTE ADJUST" push button switch is depressed, the last digit slowly increments through "6," "7," "8," "9," and back to "5."

Figure 2:
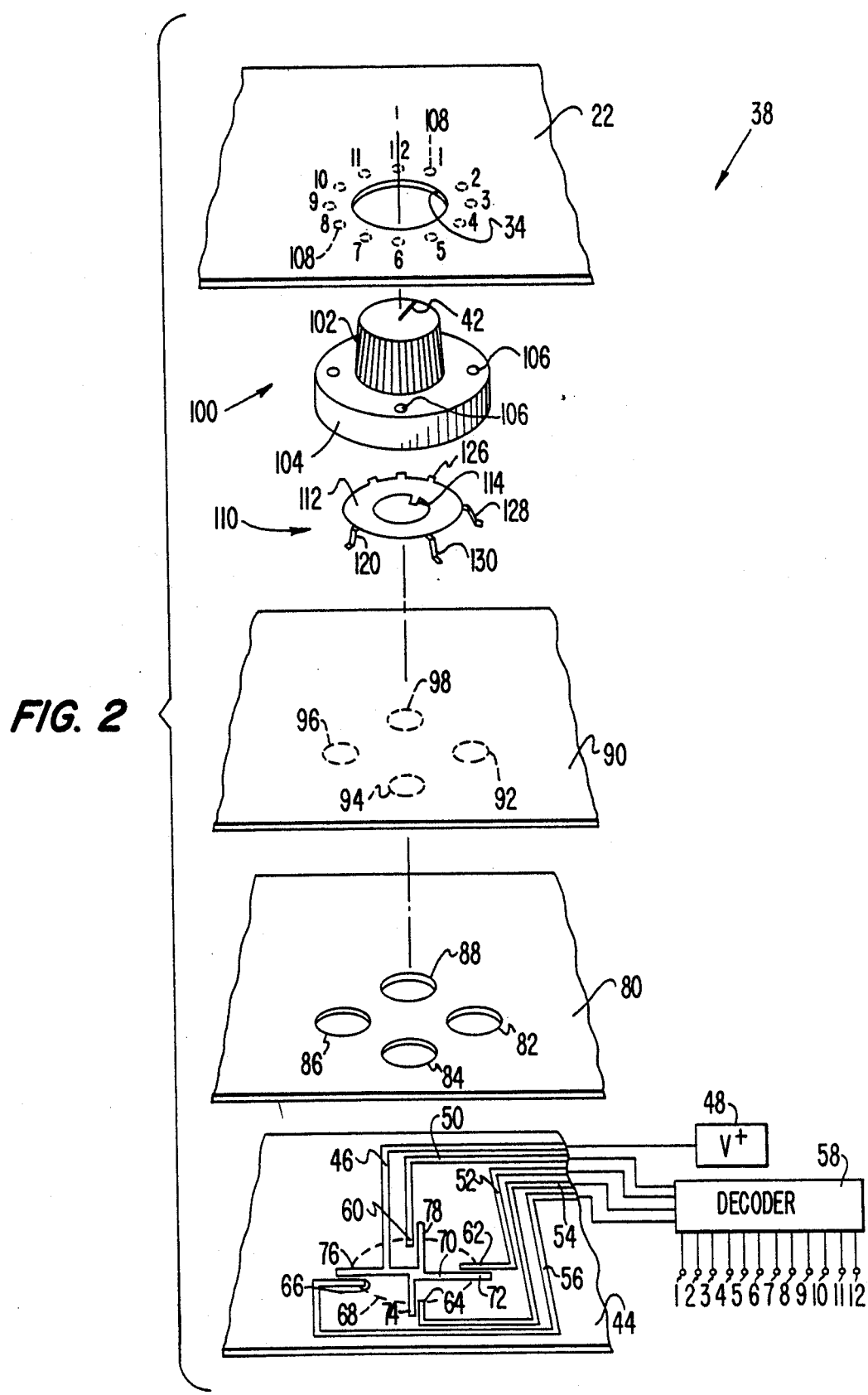
FIG. 2 is an exploded perspective view illustrating a rotary switch in accordance with one embodiment of the invention.

FIG. 2 is an exploded perspective of rotary switch 38. Printed circuit board (PCB) 44 includes a printed wiring conductor 46 which is connected to a voltage source 48 such as a power supply mounted on PCB 44. PCB 44 also includes printed wiring conductors 50, 52, 54, and 56 which are connected to a decoder 58 mounted on PCB 44. Printed wiring conductors 50–56 terminate respectively at printed wiring contacts 60, 62, 64, and 66 which are disposed in a pattern so that they extend through an imaginary circle 68. A voltage distribution printed wiring pattern 70 is connected to conductor 46 and terminates in printed wiring contacts 72, 74, 76, and 78, which traverse imaginary circle 68. As will be seen from FIG. 2, in switch 38 the printed wiring contacts 60–66 and 72–78 are arranged in four pairs, with contacts 62 and 72 forming one pair, contacts 64 and 74 forming another pair, contacts 66 and 76 forming the third pair, and contacts 60 and 78 forming the last pair. These contact pairs are disposed at 90° intervals on PCB 44.

A plastic spacer sheet 80 rests on PCB 44 and has four openings 82, 84, 86 and 88 which are positioned over the printed wiring contact pairs. The pair of printed wiring contacts 62 and 72 is exposed through opening 82, the pair of printed wiring contacts 64 and 74 is exposed through opening 84, etc. A plastic contactor sheet 90 rests on spacer sheet 80. Affixed to the underside of sheet 90 are contactor elements 92, 94, 96, and 98. The contactor elements 92-98 are positioned so that they lie at the centers of openings 82-88 and are normally spaced above the underlying pairs of printed wiring contacts on PCB 44. However if pressure is exerted on sheet 90 above one of the contactor elements 92-98, the contactor element is pressed through the respective opening 82-88 and bridges the respective pair of printed wiring contacts on PCB 44. For example, if pressure is exerted on sheet 90 above contactor element 92, contactor element 92 is depressed through opening 82 and bridges printed wiring contacts 62 and 72, thereby electrically connecting voltage source 48 to decoder 58 via printed wiring conductor 52.

With continuing reference to FIG. 2, rotary switch 38 also includes a knob member 100 having a handle portion 102 which extends through opening 34. Knob member 100 also has a base portion 104 which is positioned beneath panel 22. The upper surface of base portion 104 has rounded projections 106 which fit into cavities 108 molded into the underside of panel 22 when knob member 100 is rotated by an angle corresponding to one hour. Contactor member 110, which will be discussed in more detail later, acts as a spring between contactor sheet 90 and knob member 100 to bias knob member 100 against the underside of panel 22. The four projections 106 (only three being shown in FIG. 2) fit into four of the cavities 108 when pointer 42 is directed at the "1 o'clock" position, for example, and when handle portion 42 is rotated clockwise the projections 106 cause member 100 to move down slightly against the restoring force of contactor member 110 as the projections 106 slide out of cavities 108. When pointer 42 reaches the "2 o'clock" position, the projections 106 are again aligned with cavities 108 and the upward force imparted by contactor member 110 urges the projections 106 into the cavities 108. This provides a tactile sensation or "click-stop" feeling which permits the operator to rotate knob member 100 precisely to the desired hour. In this example there are four projects 106, but this number is not at all critical and has merely been selected to balance the forces acting on knob member 100 to prevent it from wobbling.

Figure 3:
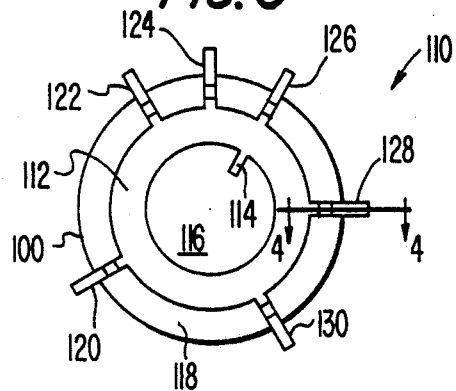
FIG. 3 is a bottom plan view of the knob and contactor member illustrated in FIG. 2.
Figure 4:
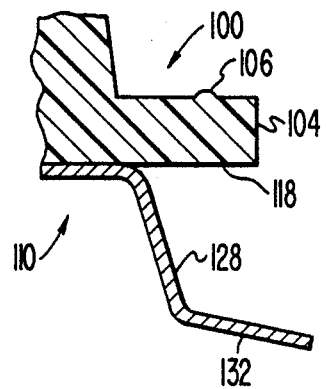
FIG. 4 is a cross-sectional view taken along the ling 4—4 of FIG. 3.

Turning next to FIGS. 2, 3, and 4 together, contactor member 110 is made of a springy material such as heat-treated phosphor bronze. It includes a generally washer-shaped upper portion 112 having a central opening into which an aligning leg 114 extends. Upper portion 112 is affixed to the underside of base portion 104, which has a generally circular central portion 116 that extends past the surface of peripheral portion 118 of base portion 104 by a distance slightly greater than the thickness of upper portion 112 of contactor member 110. When contactor member 110 is mounted on base portion 104, the central portion 116 extends through the opening in upper portion 112 of contactor member 110 and aligning leg 114 extends into a slot in portion 116 to precisely align contactor member 110 with respect to knob member 100.

Six contactor legs 120-130 extend from the outer periphery of upper portion 112 of contactor member 110. The contactor legs are bent, as illustrated generally in FIG. 4, to provide springiness when the foot regions 132 are pressed against contactor sheet 90.

Leg 122 is spaced 30° from leg 124, which is spaced 30° from leg 126. Leg 126 is spaced 60°. from leg 128, which is spaced 60° from leg 130. Finally, leg 120 is spaced 90° from leg 130 and 90° from leg 122. These angular spacings can be interpreted in terms of hours. The spacing between legs 122, 124, and 126 corresponds to one hour; the spacing between legs 126, 128, and 130 corresponds to two hours; and leg 120 is spaced from the adjacent legs 122 and 130 by three hours.

Figure 5A:
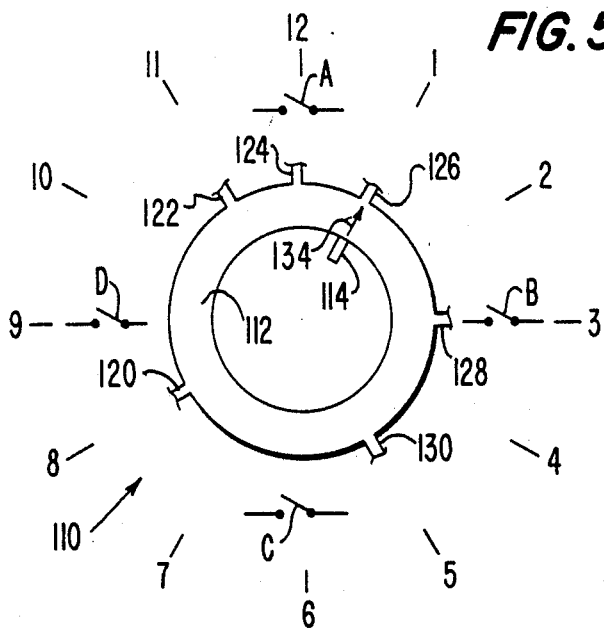
FIGS. 5A, 5B, and 5C are top views of the contactor member with the contactor fingers partially broken away, the contactor member being shown in different angular positions with respect to the PCB switches, which are illustrated schematically.
Figure 5B:
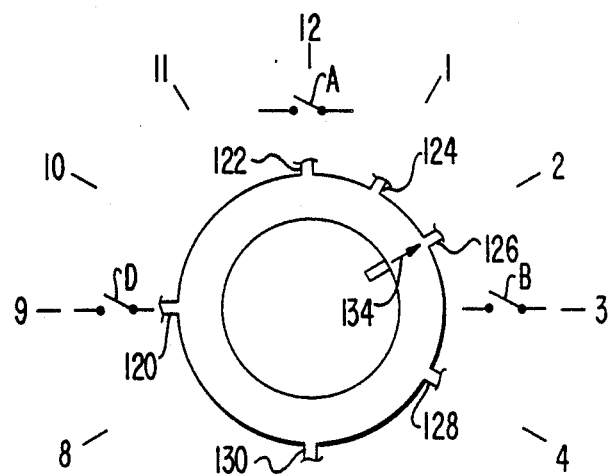
Figure 5C:
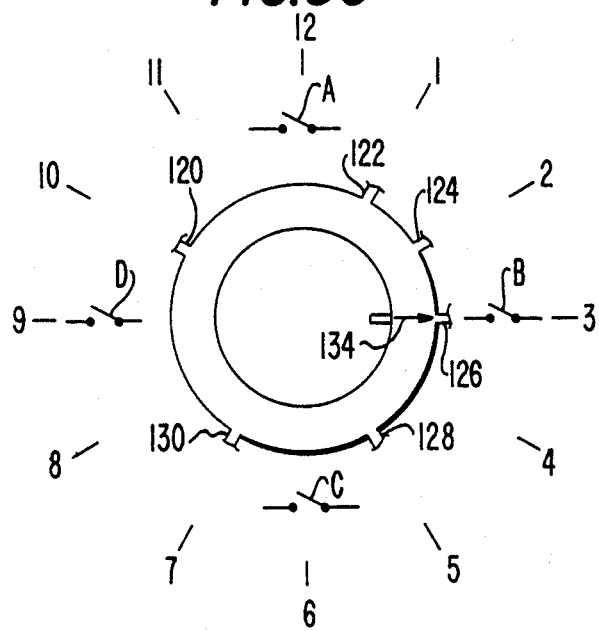

In FIGS. 5A-5C, the contactor legs 120-130 have been truncated to permit switches A-D and hour markers to be illustrated relatively close to the upper portion 112 of contactor member 110. Switch A corresponds to printed wiring contact pair 60 and 78 in FIG. 2 and is closed when this contact pair is bridged by contactor element 98; otherwise switch A is open. Switch B corresponds to printed wiring contact pair 62 and 72 of FIG. 2, and is closed only when this contact pair is bridged by contactor element 92. Similarly, switches C and D correspond respectively to contact pair 64 and 74 and contact pair 66 and 76, and are closed only when these contact pairs are bridged respectively by contactor elements 94 and 96. Switch A is positioned at the 12 o'clock position, switch B is positioned at the 3 o'clock position, switch C is positioned at the 6 o'clock position, and switch D is positioned at the 9 o'clock position, corresponding to the positions of the printed wiring contact pairs shown in FIG. 2. In FIGS. 5A-5C an arrow 134 is used as a marker to visually orient the contactor legs 120-130 with respect to pointer 42 in FIG. 2.

In FIG. 5A, arrow 134 is directed to the 1 o'clock position. Contact leg 124 closes switch A and contact leg 128 closes switch B, but contact legs 120, 122, 126, and 130 are not oriented so as to close any switches. In terms of FIG. 2, contact leg 124 extends to the center of contactor element 98, thereby depressing it through opening 88, and contactor leg extends to the center of contactor element 92, thereby depressing it through opening 82. The remaining contactor legs are either positioned outside the shoulders of openings 82-88 or between the openings 82-88, and thus do not depress contactor elements through the openings to close a switch.

In FIG. 5B, arrow 134 has been directed to the 2 o'clock position, and switches A, C, and D are closed. At the 3 o'clock position shown in FIG. 5C, only switch B is closed. Diagrams corresponding to FIGS. 5A-5C could be drawn for all of the hours, in which case the following Table (where an "X" is used to indicate a closed switch) would result:

TABLE

| Time | Switches Closed | | | |
|---|---|---|---|---|
| | Switch A | Switch B | Switch C | Switch D |
| 1:00 | X | X | | |
| 2:00 | X | | X | X |
| 3:00 | | X | | |
| 4:00 | | X | X | |
| 5:00 | X | X | | X |
| 6:00 | | | X | |
| 7:00 | | | X | X |
| 8:00 | X | X | X | |
| 9:00 | | | | X |
| 10:00 | X | | | X |
| 11:00 | | X | X | X |
| 12:00 | X | | | |

Figure 6:
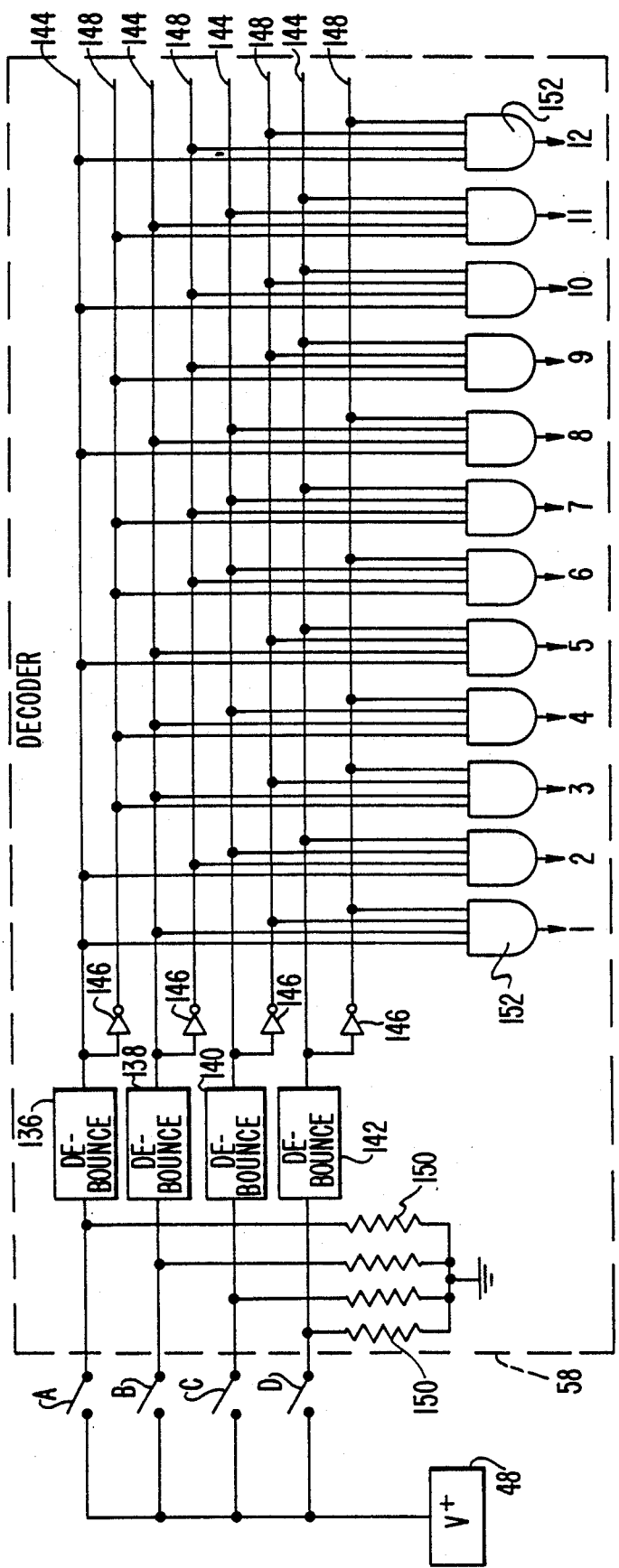
FIG. 6 is a schematic diagram of the decoder in FIG. 2.

It will be apparent to those skilled in the art that the four switches A-D could be used to encode sixteen states rather than twelve, but for sixteen states a corresponding sixteen angular positions of the knob member 100 would be needed. In FIG. 6, the four switches corresponding to the printed wiring contact pairs (60-66 and 72-78) and their corresponding contactor elements (92-98) are again represented by switches A-D. Voltage source 48 is connected to decoder 58 through these switches. Within decoder 58, a de-bounce circuit 136 is connected to switch A, a de-bounce circuit 138 is connected to switch B, a de-bounce circuit 140 is connected to switch C, and a de-bounce circuit 142 is connected to switch D. The output of each de-bounce circuit is connected directly to a "true" conductor 144 and indirectly, through an invertor 146, to a "false" conductor 148. The input of each de-bounce circuit is connected to a pull-down resistor 150. Accordingly, it will be apparent that, when switch A is closed, the signal on the true conductor 144 associated with de-bounce circuit 136 will be digitally "1" and the potential on the false conductor 148 associated with de-bounce circuit 136 will be digitally "0." When switch A is open, these potentials will be reversed. It will also be apparent that the potentials on the conductors 144 and 148 associated with the remaining de-bounce circuits and their respective switches are determined in a similar manner.

Decoder 58 also includes twelve AND gates 152 which are connected to the true and false conductors 144 and 148 in the manner illustrated. These connections are based on the foregoing Table. For example, from the Table it will be seen that switches A and B are closed at the 1 o'clock position, and in this situation FIG. 6 indicates that the left-most gate 152 (identified by the hour designation 1") is ON while the remaining gates 152 (identified by the hour designations "2" through "12") are OFF. Each time pointer 42 (FIG. 2) is directed toward an hour designation, one and only one of the gates 152 turns ON to provide an electrical indication of the hour identified by pointer 42. It should be noted that it is immaterial whether pointer 42 is rotated clockwise or counterclockwise.

Figure 7:
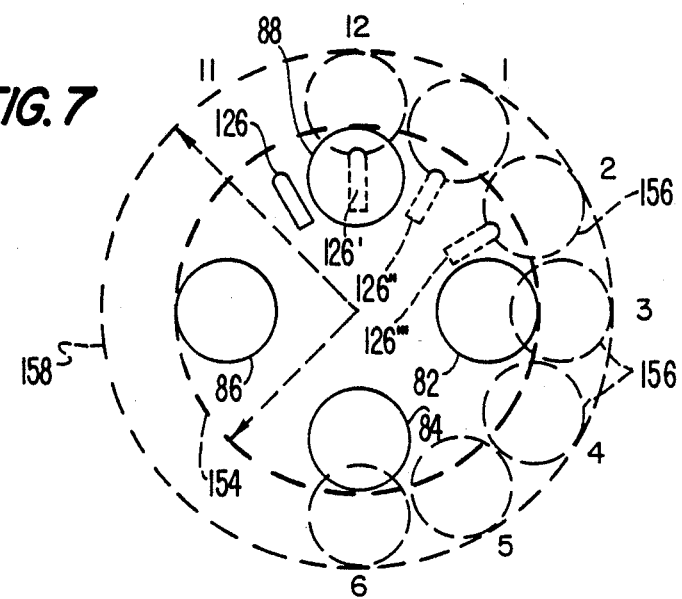
FIG. 7 schematically illustrates the PCB area devoted to a switch in accordance with FIG. 2, in comparison with the equivalent area that would be needed for a rotary switch that is used without a decoder.

FIG. 7 is provided to schematically illustrate how the use of four switches A-D coupled with decoder 58 uses less printed circuit board area than would be required if the rotary switch employed twelve contact pairs located at 30° intervals. In FIG. 7, the small circles shown in solid lines correspond to openings 82-88 in FIG. 2 and are marked with the corresponding reference numbers. Only one of the contactor legs—contactor leg 126—is shown in FIG. 7. This contactor leg is shown in solid lines when it is directed toward the 11 o'clock position. Reference number 126' identifies contactor leg 126 when it is rotated to the 12 o'clock position; reference number 126" identifies contactor 126 when it is rotated to the 1 o'clock position; and reference number 126''' identifies contactor leg 126 when it is rotated to the 2 o'clock position. It will be seen that contactor leg 126 is positioned adjacent the left-shoulder of opening 88 at the 11 o'clock position and adjacent the right shoulder of opening 88 at the 1 o'clock position, so that the underlying switch will be closed at the 12 o'clock position but not the adjacent positions of contactor leg 126. Similarly, the spacing shown in FIG. 7 is such that undesired switch closings do not occur at other angular positions of contactor leg 126, or the remaining contactor legs. The printed circuit board area required when four switches and a decoder are used is thus identified by dotted circle 154. In contrast, the small dotted circles 156 define the individual switch areas that would be needed if twelve individual switches were used, and the total area required by the resulting rotary switch is identified by large dotted circle 158. In this example the radius of circle 15 is approximately 144 units and the radius of circle 154 is approximately 130 units, so a rotary switch made from twelve individual switches would require almost a quarter more space than the rotary switch 38, which is made from four switches. This economical utilization of space results even though the openings 82-88 are positioned to provide very liberal shoulder regions in the example shown in FIG. 7.

Returning to FIG. 2, in switch 38 printed wiring contact pairs (e.g., 62 and 72, 64 and 74, etc.) are provided on PCB 44. It will be apparent that single printed circuit contacts rather than contact pairs could be employed if printed wiring were used on the underside of plastic contactor sheet 90. In such a modification, the printed wiring conductor 46, the voltage distribution printed wiring conductor pattern 70, and the printed wiring contacts 72-78 would not be needed on printed circuit board 44, and instead corresponding conductors would be printed on the underside of sheet 90 to connect contactor elements 92-98 to voltage source 48.

Figure 10:
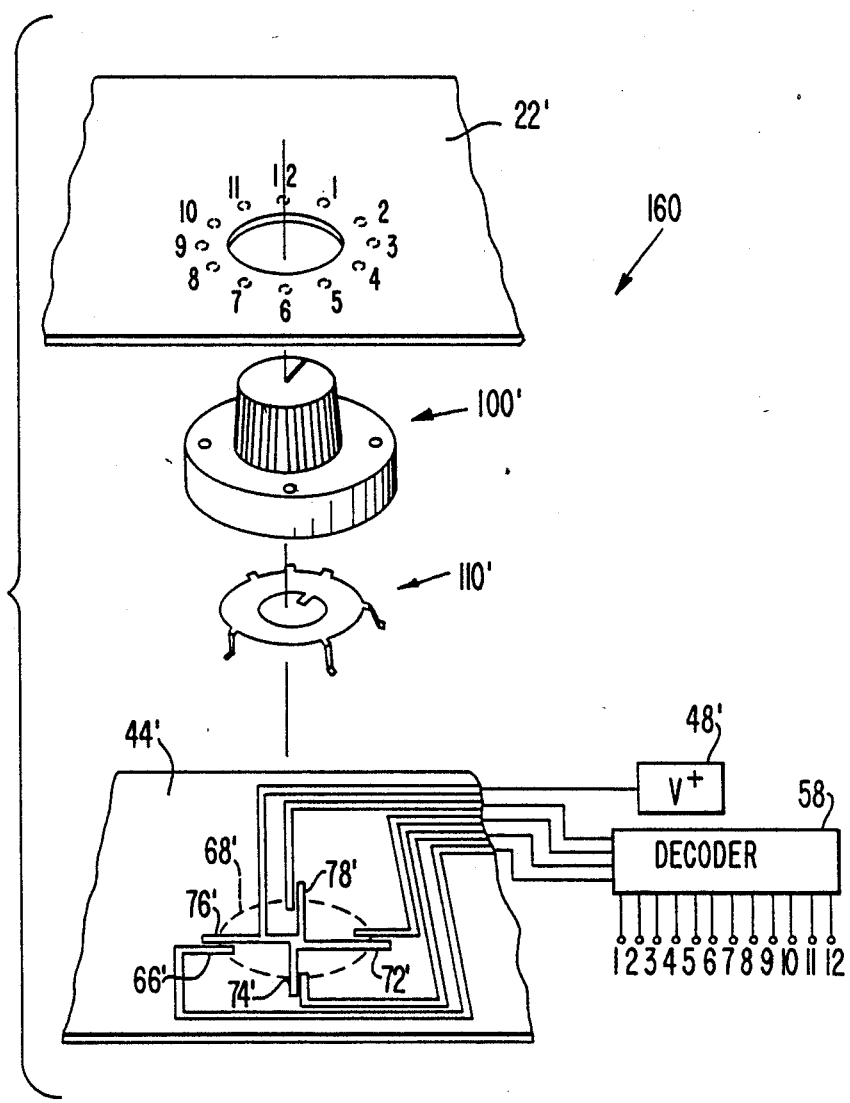
FIG. 10 is an exploded perspective view illustrating another embodiment of a rotary switch in accordance with the invention.

Another modification is shown in FIG. 10, where a rotary switch 160 omits the plastic spacer sheet 80 and the plastic contactor sheet 90 shown in FIG. 2. The remaining elements in FIG. 10 are the same as those shown in FIG. 2 and bear the same reference numbers, with a prime added. In switch 160 the contact legs of contact member 110' slide directly on PCB 44' along imaginary circle 68', and make electrical contact with the printed wiring contacts directly. At every hourly position, the contactor legs of contactor member 110' can directly close a pair of printed wiring contacts (for example, 66' and 76'). It is worth noting that contactor member 110' as a whole is at the potential of voltage source 48' at every hour position, but this does not interfere with the operation of switch 160.

Figure 9:
FIG. 9 is a sectional view through a portion of the contactor sheet used with the knob of FIG. 8, and illustrates a blister region in a contactor sheet and a contactor element affixed to the blister region.
Figure 8:
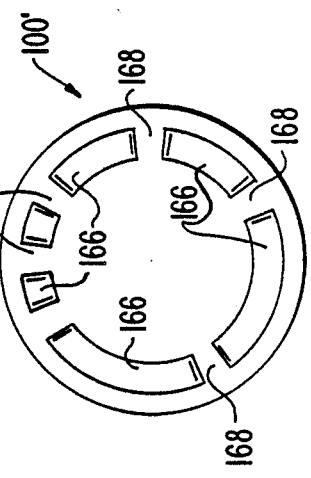
FIG. 8 is a bottom plan view of a knob employed in another embodiment of a rotary switch in accordance with the present invention.

Finally, FIGS. 8 and 9 illustrate essential components of another embodiment, which employs a modified plastic contactor sheet 90' having four blister regions 162 (only one of which is shown) which are positioned over the printed wiring contact pairs (e.g., 62 and 72, 64 and 74, 66 and 76, and 60 and 78 shown in FIG. 2). Plastic spacer sheet 80 (FIG. 2) is not needed, since the blister regions 162 normally keep the contactor elements 164 out of electrical contact with the printed wiring contact pairs. FIG. 9 illustrates the underside of a knob member 100' used in conjunction with contactor sheet 90'. Knob 100' has slots 166 and cam portions 168 between the slots 166. Blister regions 162 ride in the slots 166 until they encounter cam regions 168, whereupon the blister regions 162 are collapsed against the underlying printed wiring contact pairs. As will be noted by comparing FIGS. 3 and 8, the angular positions of cam portions 168 correspond to the angular positions of the contactor legs of contactor member 110'.

It will be understood that the above description of the present invention is susceptible to various modifications, changes, and adaptations, and the same are intended to be comprehended within the meaning and range of equivalents of the appended claims.

What I claim is:

1. A rotary switch for use with electrical equipment, comprising:
   a panel with an opening therein;

a printed circuit board disposed beneath the panel, the printed circuit board having four printed wiring contacts with are disposed along a circular path at 90° intervals.

a knob member having a handle portion which extends through the opening in the panel and having a base portion which is positioned between the panel and the printed circuit board, the knob member being rotatable through a plurality of different angular positions;

a plurality of contactor elements disposed above the circular path;

means, movable by the knob member, for selectively bringing the contactor elements into electrical contact with the printed wiring contacts when the knob member is rotated, the means for selectively bringing including means for bringing a single printed wiring contact into electrical contact with a contactor element at a predetermined one of the angular positions of the knob member, for bringing a pair of the printed wiring contacts into electrical contact with contactor elements at another predetermined one of the angular positions of the knob member, and for bringing three of the printed wiring contacts into electrical contact with contactor elements at a further predetermined one of the angular position of the knob member; and decoder means for determining which printed wiring contacts are in electrical contact with a contactor member and for providing more than four output states as a function of the angular position of the knob member.

2. The rotary switch of claim 1, wherein the panel is an outer panel of the electrical equipment and has a bottom side, wherein the base portion of the knob member has an upper side, wherein one of the bottom side of the panel and the upper side of the base portion has recesses and the other of the bottom side of the panel and the upper side of the base portion has projections which fit into the recesses, and wherein the means for selectively bringing comprises means for urging the base portion of the knob member away from the printed circuit board and against the panel.

3. The rotary switch of claim 2, wherein the means for urging comprises a contactor member affixed to the base portion of the knob member, the contactor member having a plurality of springy contactor legs which press the base portion of the knob member toward the panel and which are spaced apart from one another by predetermined angles, with the predetermined angle between at least one pair of adjacent contactor legs being substantially greater than the predetermined angle between at least one other pair of adjacent contactor legs.

4. The rotary switch of claim 3, wherein the contactor legs have foot regions, the foot regions of the contactor legs providing the contactor elements which are selectively brought into electrical contact with the printed wiring contacts when the knob member is rotated.

5. The rotary switch of claim 4, further comprising means for maintaining the contactor elements at a predetermined potential when the knob member is at the different angular positions.

6. The rotary switch of claim 3, further comprising four additional printed wiring contacts on the printed circuit board, the printed wiring contacts and additional printed wiring contacts being disposed in contact pairs, and wherein the means for selectively bringing further comprises a spacer sheet having openings which are positioned over the contactor pairs and a contactor sheet disposed between the contactor legs and the spacer sheet, the contactor legs slidably engaging the contactor sheet, and wherein the contactor elements are affixed to the contactor sheet at positions aligned with the openings in the spacer sheet.

7. The rotary switch of claim 3, wherein the means for selectively bringing further comprises a spacer sheet having openings which are positioned over the printed wiring contacts and a contactor sheet disposed between the contactor legs and the spacer sheet, the contactor legs slidably engaging the contactor sheet, and wherein the contactor elements are affixed to the contactor sheet at positions aligned with the openings in the spacer sheet.

8. The rotary switch of claim 2, further comprising four additional printed wiring contacts on the printed circuit board, the printed wiring contacts and additional printed wiring contacts being disposed in contact pairs, and wherein the means for selectively bringing comprises a contactor sheet which rests on the printed circuit board and which has blister regions disposed above the contact pairs, the contactor elements being affixed to the contactor sheet at the blister regions, and cam means carried by the base portion of the knob member for selectively collapsing the blister regions when the knob member is rotated, the cam means including a plurality of cams which are spaced apart from one another by predetermined angles, with the predetermined angle between at least one pair of adjacent cams being substantially greater than the predetermined angle between at least one other pair of adjacent cams.

9. The rotary switch of claim 1, wherein the means for selectively bringing comprises a contactor member affixed to the base portion of the knob member, the contactor member having as plurality of springy contactor legs which press the base portion of the knob member away from the printed circuit board and toward the panel, the contactor legs being spaced apart from one another by predetermined angles, with the predetermined angle between at least one pair of adjacent contact legs being substantially greater than the predetermined angle between at least one other pair of adjacent contactor legs.

10. The rotary switch of claim 9, wherein the contactor legs have foot regions, the foot regions of the contactor legs providing the contactor elements which are selectively brought into electrical contact with the printed wiring contacts when the knob member is rotated.

11. The rotary switch of claim 14, further comprising means for maintaining the contactor elements at a predetermined potential when the knob member is at the different angular positions.

12. The rotary switch of claim 9, further comprising four additional printed wiring contacts on the printed circuit board, the printed wiring contacts and additional printed wiring contacts being disposed in contact pairs, and wherein the means for selectively bringing further comprises a spacer sheet having openings which are positioned over the contactor pairs and a contactor sheet disposed between the contactor legs and the spacer sheet, the contactor legs slidably engaging the contactor sheet, and wherein the contactor elements are affixed to the contactor sheet at positions aligned with the openings in the spacer sheet.

13. The rotary switch of claim 9, wherein the means for selectively bringing further comprises a spacer sheet having openings which are positioned over the printed wiring contacts and a contactor sheet disposed between the contactor legs and the spacer sheet, the contactor legs slidably engaging the contactor sheet, and wherein the contactor elements are affixed to the contactor sheet at positions aligned with the openings in the spacer sheet.

14. The rotary switch of claim 1, further comprising four additional printed wiring contacts on the printed circuit board, the printed wiring contacts and additional printed wiring contacts being disposed in contact pairs, and wherein the means for selectively bringing comprises a contactor sheet which rests on the printed circuit board and which has blister regions disposed above the contact pairs, the contactor elements being affixed to the contactor sheet at the blister regions, and cam means carried by the base portion of the knob member for selectively collapsing the blister regions when the knob member is rotated, the cam means including a plurality of cams which are spaced apart from one another by predetermined angles, with the predetermined angle between at least one pair of adjacent cams being substantially greater than the predetermined angle between at least one other pair of adjacent cams.

15. A rotary switch for use with electrical equipment, comprising:
a panel;
a printed circuit board spaced apart from the panel;
a switch assembly having a plurality of switches, each switch including a respective printed wiring contact which is affixed to the printed circuit board, the printed wiring contacts being disposed along a circular path;
a knob member having a handle portion and having a base portion which is disposed between the panel and the printed circuit board, the knob member being rotatable via its handle portion through a plurality of different angular positions;
closure means, mounted on the base portion of the knob member and extending toward the circular path, for closing a single switch at one angular position of the knob member and for closing a pair of switches at another angular position of the knob member; and
decoder means connected to the switches for providing a greater number of output states than the number of switches in the switch assembly, the decoder means providing the output states in accordance with which switches of the switch assembly are closed, and without reference to prior output states.

16. The rotary switch of claim 15, wherein the panel has an opening and the handle portion of the knob member extends through the opening in the panel, and further comprising means for providing a tactile sensation at the plurality of different angular positions as the knob member is manually rotated.

17. The rotary switch of claim 15, wherein the closure means additionally includes means for closing three switches of the switch assembly at a further angular position of the knob member.

18. The rotary switch of claim 15, wherein the knob member has a axis about which it is rotatable, and wherein the closure means comprises a contactor member affixed to the base portion of the knob member, the contactor member having a plurality of contactor legs, one of the contactor legs being disposed at a first acute angle with respect to the axis of rotation from an adjacent contactor leg and being disposed at a second acute angle with respect to the axis of rotation from another adjacent contactor leg, the second acute angle being substantially greater than the first acute angle.

19. The rotary switch of claim 18, wherein the switch assembly additionally includes a contactor sheet between the contactor member and the printed circuit board; contactor elements on the contactor sheet, the contactor elements being positioned above the printed wiring contacts on the printed circuit board; and a spacer sheet between the contactor sheet and the printed circuit board, the spacer sheet having openings between the printed wiring contacts and the contactor elements, wherein the contactor legs slide on the contactor sheet as the knob member is rotated and press the contactor elements against the printed wiring contacts on the printed circuit board.

20. The rotary switch of claim 19, wherein the switch assembly further includes additional printed wiring contacts affixed to the printed circuit board and disposed along the circular path, a respective printed wiring contact and a respective additional printed wiring contact being included in each switch as a contact pair.

21. The rotary switch of claim 18, wherein the contactor member is metallic and the contactor legs touch the printed wiring contacts on the printed circuit board as the knob member is rotated.

22. The rotary switch of claim 15, wherein the switch assembly additionally includes a contactor sheet between the knob member and the printed circuit board, the contactor sheet having blister regions above the printed wiring contacts on the printed circuit board, the switch assembly further including contactor elements in the blister regions, wherein the knob member has an axis about which it is rotatable, and wherein the closure means comprises cams on the base portion of the knob member to collapse the blister regions when the knob member is rotated, one cam being disposed at a first acute angle with respect to the axis of rotation from an adjacent cam and being disposed at a second acute angle with respect to the axis of rotation from another adjacent leg, the second acute angle being substantially greater than the first acute angle.

* * * * *